US007543098B2

(12) United States Patent
Lederer et al.

(10) Patent No.: US 7,543,098 B2
(45) Date of Patent: Jun. 2, 2009

(54) COMPUTER MAINBOARD

(75) Inventors: Friedrich Lederer, Thalmässing (DE); Immanuel Koehn, Augsburg (DE)

(73) Assignee: Fujitsu Siemens Computers GmbH, Munich (DE)

( * ) Notice: Subject to any disclaimer, the term of this patent is extended or adjusted under 35 U.S.C. 154(b) by 499 days.

(21) Appl. No.: 10/949,122

(22) Filed: Sep. 24, 2004

(65) Prior Publication Data

US 2005/0079741 A1 Apr. 14, 2005

(30) Foreign Application Priority Data

Sep. 25, 2003 (DE) ................................ 103 44 644

(51) Int. Cl.
*G06F 13/00* (2006.01)
*H05K 7/10* (2006.01)
*G06F 15/16* (2006.01)
*G06F 13/14* (2006.01)

(52) U.S. Cl. ........................ 710/301; 710/300; 345/502; 345/519; 345/520

(58) Field of Classification Search ................. 710/301, 710/303, 316–317, 38, 104, 300; 345/502, 345/519–520; 361/748, 761
See application file for complete search history.

(56) References Cited

U.S. PATENT DOCUMENTS 4,720,798 A * 1/1988 Reed et al. .................... 716/19
5,564,930 A * 10/1996 Yu .............................. 439/61
6,094,690 A 7/2000 Lee
6,121,949 A * 9/2000 Ramamurthy et al. ........ 345/101
6,141,021 A 10/2000 Bickford et al.
6,267,624 B1 * 7/2001 Wu et al. .................... 439/607
2002/0095533 A1 * 7/2002 Esterberg et al. ............... 710/8
2002/0097234 A1 * 7/2002 Sauber ....................... 345/204
2003/0142089 A1 7/2003 Myers
2005/0225549 A1 * 10/2005 Diamond et al. ............ 345/418
2005/0237327 A1 * 10/2005 Rubinstein et al. .......... 345/519

FOREIGN PATENT DOCUMENTS

JP 0426011 9/1992

OTHER PUBLICATIONS

"Peripheral Component Interconnect". The Free On-Line Dictionary of Computers. Online Dec. 7, 1997. Retrieved from Internet Apr. 24, 2007. <http://foldoc.org/index.cgi?query=pci>.*
"LVDS Owner's Manual". National Semiconductor Corporation. Apr. 25, 1997. Chapter 1. pp. 1-7.*

(Continued)

*Primary Examiner*—Thomas J Cleary
(74) *Attorney, Agent, or Firm*—Cohen Pontani Lieberman & Pavane LLP

(57) ABSTRACT

A computer mainboard (1), for example for notebook computers, having an integrated graphics component (2), which has at least one signal output (3), and at least one connection (5) for a display unit. A first plug connector (4) having at least one electrical connection is coupled to the signal output (3) of the integrated graphics component (2). A second plug connector (6) is coupled to the connection (5) for a display unit. At least one releasable electrical connection component (8) is provided between the first plug connector (4) and the second plug connector (6).

7 Claims, 1 Drawing Sheet

OTHER PUBLICATIONS

Tyson, Jeff. "How Graphics Cards Work". howstuffworks.Online Apr. 13, 2003. Retrieved from Internet Mar. 31, 2008. pp. 1-3. <http://wweb.archive.org/web/20030413052440/http://computer.howstuffworks.com/graphics-card.htm>.*

Ross, Phillip. "Hardware Review: 3Dfx Graphics Card". Linux Focus. Online Jan. 1998. Retrieved from Internet Oct. 6, 2008. <http://www.linuxfocus.org/English/January1998/article18.html>.*

* cited by examiner

COMPUTER MAINBOARD

CROSS-REFERENCE TO RELATED APPLICATIONS

This patent application claims the priority of German patent application No. 103 44 644.3 filed Sep. 25, 2003, the disclosure content of which is hereby incorporated by reference.

FIELD OF THE INVENTION

The invention relates to a computer mainboard, for example for notebook computers, having an integrated graphics component, which has at least one signal output, and at least one connection for a display unit.

BACKGROUND OF THE INVENTION

Production processes in computer technology require a high level of optimization in order, on the one hand, to be able to withstand the high quality requirements and, on the other hand, to be able to withstand the prevailing pressure on prices at the same time. This means that not only individual components of a computer system but rather entire computer systems are being manufactured and sold in standardized form. However, unaffected by this, special wishes of a person buying a computer system must be taken into account and must remain capable of being implemented. This can then only be achieved, if at all, with a high level of outlay on account of the preceding standardization.

SUMMARY OF THE INVENTION

One object of the invention is to provide computer mainboards, particularly for notebook computers, in such a manner that, even when there is an integrated graphics component in the computer mainboard, the choice of using such graphics component or alternatively using graphics components other than the integrated graphics component remains open.

This and other objects are attained in accordance with one aspect of the present invention directed to a computer mainboard, for example for notebook computers, having an integrated graphics component, which has at least one signal output, and at least one connection for a display unit. A first plug connector having at least one electrical connection is connected to the signal output of the integrated graphics component and a second plug connector is connected to the connection for a display unit. At least one releasable electrical connection component is provided betwween the first plug connector and the second plug connector (6).

In one embodiment of the invention, a computer mainboard, for example for a notebook computer, has an integrated graphics component and also has a connection for a display unit such as, for example, a monitor or a display. The computer mainboard advantageously has the features which are described briefly in more detail below:

1. The integrated graphics component of the computer mainboard has an output which, for its part, has a video signal that can only be processed by a display unit.
2. The integrated graphics component furthermore has an output to which a graphics raw signal—which cannot be forwarded to a display unit until it has been processed by a graphics component—is applied.
3. These outputs from the integrated graphics component are connected to a plug connector on the computer mainboard and end in this plug connector.

4. The connections of the computer mainboard for the display unit are likewise connected to a plug connector and end in this plug connector.
5. In order, then, to pass the graphics signals from the integrated graphics component to the connections of the computer mainboard for the display unit, a releasable electrical connection component is provided between the two plug connectors.

This has the advantage that this connection component may alternatively include, if appropriate, additional graphics components.

In one embodiment of the invention, the releasable connection component between the two plug connectors is implemented in a space-saving manner by means of a printed circuit board. In this case, the printed circuit board contains corresponding conductor tracks which forward signals. If the printed circuit board does not contain any further graphics components, the graphics raw signal is expediently not routed any further on the printed circuit board since there is no graphics processing component such as, for example, a graphics processor. By contrast, however, the video signals are forwarded to the connections for the display unit using the printed circuit board and the conductor tracks situated thereon. In this case, the video output of the integrated graphics component is not only restricted to a typical video signal but rather may also have one or more different video signals. These are, for example, a DVI signal, a VGA signal, an S-video signal or an LVDS signal.

The advantageous nature of the invention comes to light, in particular, if the printed circuit board is equipped with a graphics processor.

The graphics processor of the printed circuit board serves, for example, to produce a video signal from a graphics raw signal. To this end, it also has, if appropriate, different features than the integrated graphics component on the computer mainboard. That is to say the video signals of the integrated graphics component on the computer mainboard can, for example, expediently end at the printed circuit board and are not forwarded since the graphics raw signal of the integrated graphics component on the computer mainboard is supplied, via the printed circuit board, to the graphics processor situated on the latter. Such graphics processor processes the graphics raw signal and supplies it to the plug connector that is connected to the connection for a display unit.

When the integrated graphics component on the computer mainboard is used, the video signals are supplied, via the printed circuit board, to the connections for a display unit. If a graphics component other than the integrated graphics component on the computer mainboard is used, the printed circuit board contains the desired graphics processor, and it processes and forwards the graphics raw signal to the connections. The printed circuit boards with or without the graphics processor ideally have the same external dimensions, and the connections (arranged on the printed circuit board) to the plug connectors also correspond to one another, with the result that one or the other printed circuit board, that is to say with or without the graphics processor, can alternatively be installed on the computer mainboard by simply being plugged in. It is therefore possible, during final installation, to rapidly satisfy a customer's wish for a graphics component other than the integrated graphics component.

This likewise makes it possible, without relatively great expenditure, to offer various graphics components (which are in turn standardized) in conjunction with the printed circuit board and to install them in a very short period of time.

The graphics raw signal of the computer mainboard or the integrated graphics component may also be, for example, a PCI bus signal, an AGP signal and/or a PCI-E signal.

BRIEF DESCRIPTION OF THE DRAWINGS

The invention is explained in more detail below with reference to an exemplary embodiment and with the aid of two figures, in which.

DETAILED DESCRIPTION OF THE DRAWINGS

Figure 1:
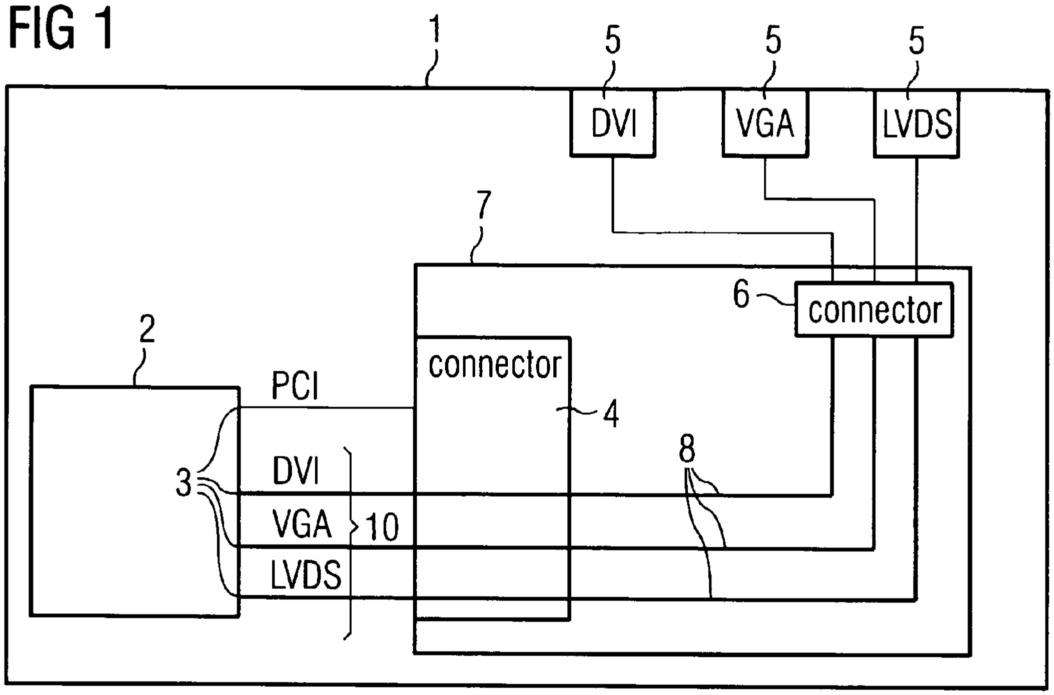
FIG. 1 shows a diagrammatic illustration of the computer mainboard according to the invention when using the integrated graphics component in the computer mainboard.

FIG. 1 shows a computer mainboard 1, on which an integrated graphics component 2 is situated. The integrated graphics component 2 has various signal outputs 3. These signal outputs 3 are connected to a first plug connector 4. The computer mainboard 1 furthermore has connections 5 for a display unit. These connections 5 are connected to a second plug connector 6 that is situated on the computer mainboard 1. Conductor tracks 8 form a releasable electrical connection component between the two plug connectors 4 and 6. Conductor tracks 8 are situated on a printed circuit board 7. This electrical connection component 8 is releasable since the printed circuit board 7 is plugged into the plug connectors 4 and 6 and is thereby held on the computer mainboard 1.

In the embodiment which is illustrated in FIG. 1 and shows the use of the integrated graphics component 2 on the computer mainboard 1, the graphics raw signal at the PCI bus signal output 3 is not routed any further by the printed circuit board 7.

Figure 2:
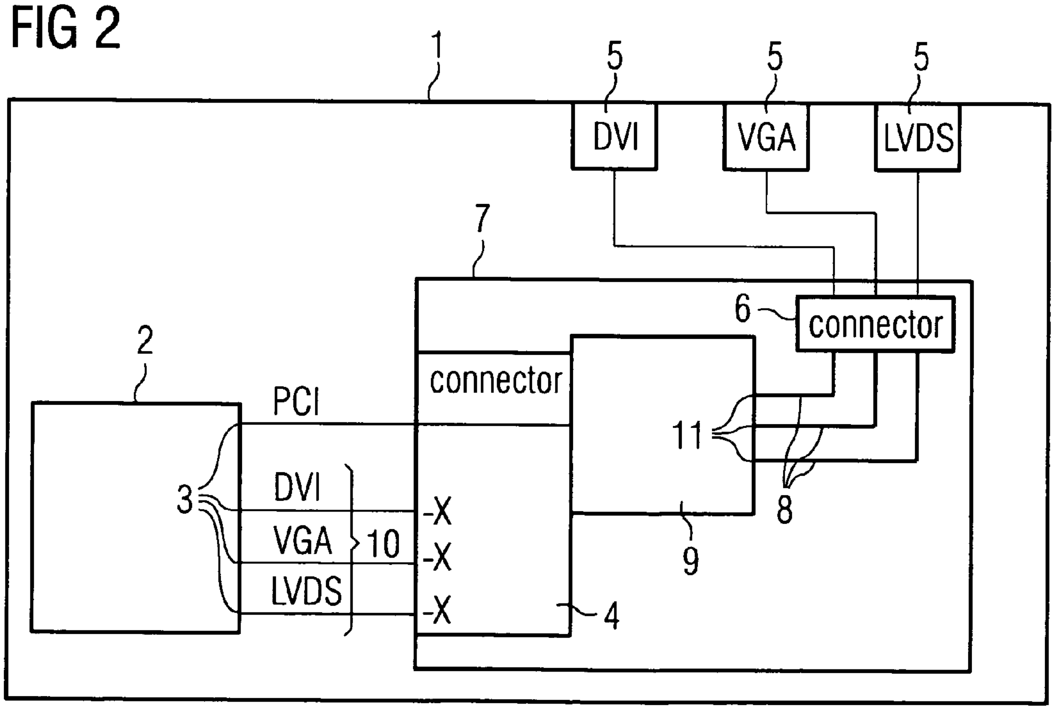
FIG. 2 shows a diagrammatic illustration of the computer mainboard according to the invention when using a graphics component other than the internal graphics component.

FIG. 2 shows the same computer mainboard 1 as in FIG. 1, with the printed circuit board 7 containing a graphics processor 9 which is a graphics component other than the integrated graphics component 2 on the computer mainboard 1. For this reason, those signal outputs 3 which, in combination, are generally referred to as video output 10 are not forwarded on the printed circuit board 7. Rather, the video raw signal of the PCI bus signal output 3 is forwarded to the graphics processor 9 on the printed circuit board 7.

Once the signal of the PCI bus signal output 3 has been processed in the graphics processor 9 to form a video signal 11, the video signal 11 is applied to the output of the graphics processor 9. This signal is forwarded to the second plug connector 6 and from there to the connections 5 for a display unit.

When the FIGS. 1 and 2 are considered together, the advantageous and thus easy and unproblematic way in which the printed circuit boards can be exchanged and also the capability of installing and using a further graphics component in order to replace or supplement the integrated graphics component 2 on the computer mainboard 1 come to light.

The scope of protection of the invention is not limited to the examples given hereinabove. The invention is embodied in each novel characterictic and each combination of characteristics, which includes every combination of any features which are stated in the claims, even if this combination of features is not explicitly stated in the claims.

We claim:

1. A computer mainboard, comprising:

an integrated graphics component, comprising at least open first output configured for providing a first video signal for display by a display unit and at least one second output configured for providing a graphics raw signal for further processing by a graphics component;

at least one connection for the display unit disposed on the computer mainboard;

a first plug connector comprising at least one electrical connection connected to the at least one first output and the at least one second output of the integrated graphics component;

a second plug connector connected to the at least one connection for a display unit such that one end of the at least one connection terminates in the second plug connector; and at least one exchangeable printed circuit board plugged into the first plug connector and the second plug connector, the printed circuit board forwarding the first video signal from the at least one first output of the integrated graphics component to the at least one connection for the display unit.

2. The computer mainboard as claimed in claim 1, wherein the printed circuit board comprises at least one graphics processor configured for processing the graphics raw signal received from at least one second output of the integrated graphics component, producing a second video signal from the received graphics raw signal, and forwarding the second video signal to the at least one connection for the display unit.

3. The computer mainboard as claimed in claim 1, wherein the first video signal output by the integrated graphics component conforms to at least one of the DVI, VGA, LVDS, and S-video standard.

4. The computer mainboard as claimed in claim 1, wherein the graphics raw signal output by the integrated graphics component conforms to at least one of the PCI, PCI-E, or AGP standard.

5. The computer mainboard as claimed in claim 4, wherein:

the exchangeable printed circuit board comprises at least one graphics processor and processes the graphics raw signal conforming to at least one of the PCI, PCI-E, or AGP standard, and the at least one graphics processor produces a second video signal that conforms to at least one of the DVI, VGA, LVDS, or S-video standard and forwards the second video signal to the at least one connection for the display unit.

6. The computer mainboard as claimed in claim 1, wherein the at least one connection for the display unit comprises at least one video output that conforms to the DVI, VGA, LVDS, or S-video standard.

7. A computer mainboard, comprising:

an integrated graphics component, comprising at least one first output configured for providing a first video signal for display by a display unit and at least one second output configured for providing a graphics row signal for further processing by a graphics component;

at least one connection for the display unit disposed on the computer mainboard;

a first plug connector comprising at least one electrical connection connected to the at least one first output and the at least one second output of the integrated graphics component;

a second plug connected to the at least one connection for a display unit such that one end of the least one connection terminates in the second plug connector; and at least one exchangeable printed circuit board plugged into the first plug connector and the second plug connector;

wherein the first video signal output by the integrated graphics component conforms to at least one of the DVI, VGA, LVDS, or S-video standard, and wherein the exchangeable printed circuit board forwards the first video signal from the at least one first output of the integrated graphics components to the at least one connection for the display unit.

* * * * *